(12) United States Patent
Koelbl et al.

(10) Patent No.: US 7,389,479 B2
(45) Date of Patent: Jun. 17, 2008

(54) FORMALLY PROVING THE FUNCTIONAL EQUIVALENCE OF PIPELINED DESIGNS CONTAINING MEMORIES

(75) Inventors: Alfred Koelbl, Dachau (DE); Jerry Burch, Portland, OR (US); Carl Pixley, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 275 days.

(21) Appl. No.: 11/436,007

(22) Filed: May 17, 2006

(65) Prior Publication Data
US 2007/0143717 A1    Jun. 21, 2007

Related U.S. Application Data

(60) Provisional application No. 60/753,333, filed on Dec. 20, 2005.

(51) Int. Cl.
*G06F 17/50* (2006.01)
(52) U.S. Cl. ............................................. 716/3; 716/5
(58) Field of Classification Search .................... 716/3, 716/5
See application file for complete search history.

(56) References Cited

U.S. PATENT DOCUMENTS 6,026,222 A * 2/2000 Gupta et al. .................... 716/5
6,247,163 B1 * 6/2001 Burch et al. .................... 716/3
7,117,465 B2 * 10/2006 Khasidashvili et al. ........ 716/5

OTHER PUBLICATIONS

R.E.Bryant, M. Velev, "Verification of Pipelined Microprocessors by Comparing Memory Execution Sequences in Symbolic Simulation", Asian'97, LNCS 1345 Springer-Verlag, Dec. 1997, pp. 18-31.

* cited by examiner

*Primary Examiner*—Jack Chiang
*Assistant Examiner*—Brandon W Bowers
(74) *Attorney, Agent, or Firm*—Park, Vaughan & Fleming LLP

(57) ABSTRACT

One embodiment of the present invention provides a system that formally proves the functional equivalence of pipelined designs. First, the system receives a specification for a first pipelined design, which includes a first memory system, and a specification for a second pipelined design, which includes a second memory system. Next, the system determines a correspondence between operations on the first memory system and corresponding operations on the second memory system. This correspondence enables memory operations to be represented in a combinational form based on design inputs, thereby allowing both memory systems to be logically abstracted out of their respective designs. After the memory systems have been abstracted out, the system compares the combinational outputs of the first pipelined design and the combinational outputs of the second pipelined design to verify that the designs are functionally equivalent.

20 Claims, 7 Drawing Sheets

FORMALLY PROVING THE FUNCTIONAL EQUIVALENCE OF PIPELINED DESIGNS CONTAINING MEMORIES

RELATED APPLICATIONS

This application claims priority under 35 U.S.C. §119(e) to U.S. Provisional Application Ser. No. 60/753,333, filed on 20 Dec. 2005, the contents of which are herein incorporated by reference.

BACKGROUND

1. Field of the Invention

The present invention relates to techniques for verifying a hardware design to ensure that the design operates correctly. More specifically, the present invention relates to a method and an apparatus for formally proving the functional equivalence of pipelined designs containing memories.

2. Related Art

Advanced Electronic Design Automation (EDA) tools presently make it possible to design extremely complex integrated circuits (ICs). EDA tools typically transform a high-level functional specification of a design into a more detailed register-transfer level (RTL) specification, which is in turn mapped to a set of transistor components and wires in a given fabrication technology. The components and their interconnections then go through a layout phase in which the system attempts to minimize the size of the circuit while also meeting detailed timing and power requirements. Throughout these steps, a set of verification and testing tools attempt to verify that the final result of the design process works and is true to the original functional specification.

While the design process has been automated where possible, some phases of the design effort remain manual. For example, a team of designers typically creates the RTL specification manually based on the system-level specification, and in doing so may introduce errors into the design. Some formal verification tools attempt to find such errors, for instance by proving the formal equivalence of a system-level specification for a design (e.g. written in C++) to the RTL version. However, due to the complexity of modern designs, verifying formal equivalence is a complicated and computationally expensive process. For instance, some pipelined designs may have a different number of stages in the system-level specification than the RTL specification, and may also include memories which can be read to or written from in every pipeline stage. Note that such memories can be large, and that the memory architecture and data layout may vary significantly between the two specifications. In order to determine whether two versions of such a pipelined design are equivalent, the verification tool attempts to prove that the contents of the memories are the same, which involves a prohibitively expensive sequential equivalence check.

Hence, what is needed is a method and an apparatus for verifying the functional equivalence of pipelined designs containing memories without the above-described problems.

SUMMARY

One embodiment of the present invention provides a system that formally proves the functional equivalence of pipelined designs. First, the system receives a specification for a first pipelined design, which includes a first memory system, and a specification for a second pipelined design, which includes a second memory system. Next, the system determines a correspondence between operations on the first memory system and corresponding operations on the second memory system. This correspondence enables memory operations to be represented in a combinational form based on design inputs, thereby allowing both memory systems to be logically abstracted out of their respective designs. After the memory systems have been abstracted out, the system compares the combinational outputs of the first pipelined design and the combinational outputs of the second pipelined design to verify that the designs are functionally equivalent.

In a variation on this embodiment, the correspondence between operations on the first memory system and corresponding operations on the second memory system simplifies the verification of functional equivalence for the designs.

In a further variation, the system compares designs with different pipeline depths, in which write accesses to memories may occur in different cycles. During this process, the system determines the correspondence between the two memory systems by symbolically simulating both pipelined designs for several cycles to discover the relationship between the first memory system and the second memory system. Next, the system guesses in which pipeline cycles the contents of the first memory system and the contents of the second memory system match. Then, the system attempts to prove by induction that the guess holds for all times.

In a further variation, the system assumes that the initial contents of the first memory system and the second memory system are substantially the same. The system then compares the outputs by unrolling the pipelines to represent design outputs as combinational blocks comprised of the pipeline stages but without pipeline registers.

In a further variation, knowing the initial state of a memory system and unrolling the pipelines allows the system to represent all subsequent read and write accesses from/to the memory system combinationally. Determining that the memory systems correspond in certain pipeline cycles allows the system to check the equivalence of the design outputs using a combinational equivalence check instead of a sequential equivalence check.

In a variation on this embodiment, the system generates a complete proof that verifies that a register-transfer-level description of a design is functionally equivalent to an original high-level description of the design.

In a variation on this embodiment, the representation of data in the first memory system is different from the representation of data in the second memory system.

In a further variation, the first memory system and/or the second memory system are comprised of multiple memories.

In a further variation, the system receives a user-generated specification that specifies how the memory system of the first pipelined design matches the memory system of the second pipelined design. The system uses this specification to assist in determining the correspondence between the first memory system and the second memory system. Note that the user-generated specification can include, for instance, a mapping of a first memory system with one memory to a second memory system with multiple memories. This specification can also include a user-specification of the timing difference between the memory systems.

In a further variation, the system knows that the data outputs from an initial set of pipeline cycles do not include meaningful values, and ignores them during the equivalence comparison.

Table 1 illustrates a set of equations that define an output and a memory operation in a design in accordance with an embodiment of the present invention.

Table 2 illustrates a template for a memory mapping between two designs in accordance with an embodiment of the present invention.

Table 3 illustrates an alternative template for a memory mapping between two designs in accordance with an embodiment of the present invention.

Table 4 illustrates a memory mapping between one memory and a set of multiple memories in accordance with an embodiment of the present invention.

Figure 2A:
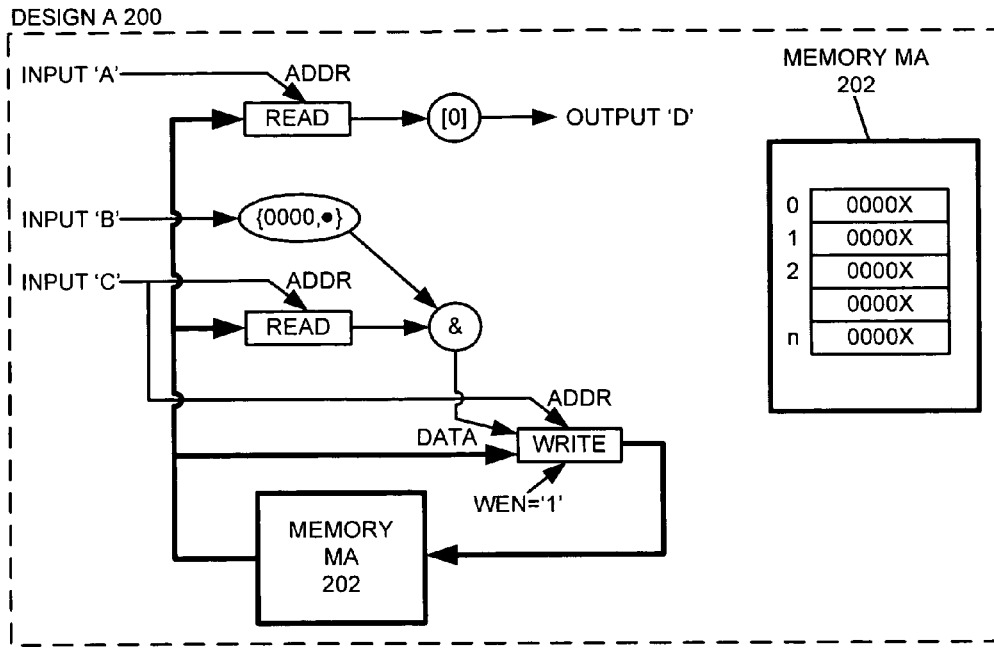
FIG. 2A illustrates a non-pipelined design in accordance with an embodiment of the present invention.
Figure 2B:
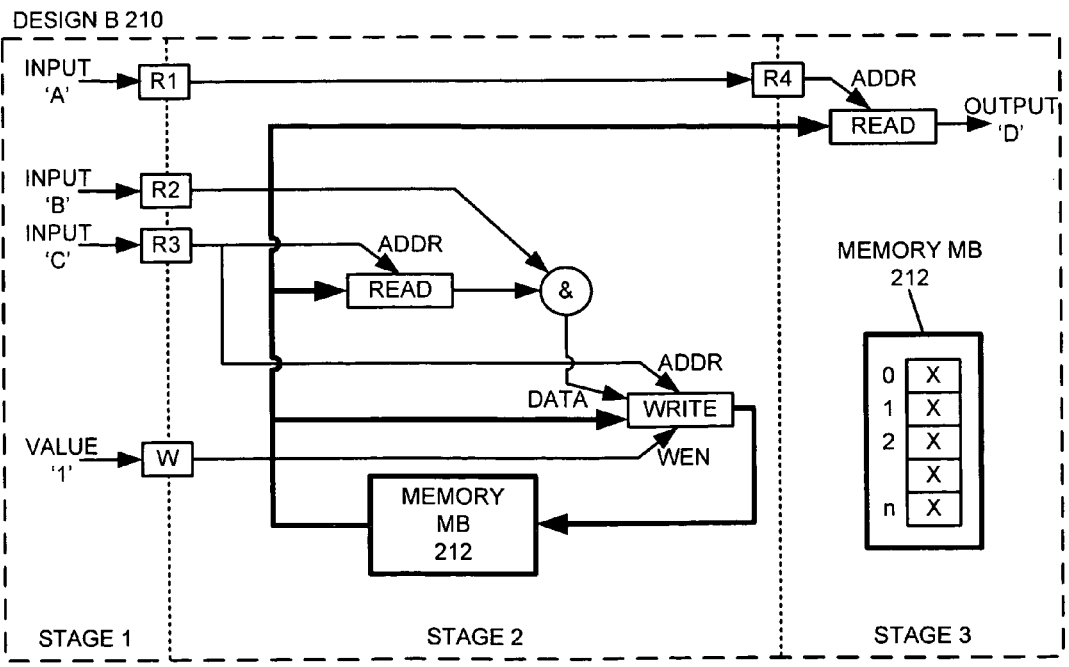
FIG. 2B illustrates a pipelined design with three pipeline stages separated by pipeline registers in accordance with an embodiment of the present invention.

Table 5 illustrates a memory mapping for the designs in FIG. 2A and FIG. 2B in accordance with an embodiment of the present invention.

Table 6 illustrates pseudocode for appending dummy stages to designs in accordance with an embodiment of the present invention.

Table 7 illustrates pseudocode for determining memory correspondence in accordance with an embodiment of the present invention.

Table 8 illustrates a memory correspondence formula (MCF) and a conjunction of memory correspondences in accordance with an embodiment of the present invention.

Table 9 illustrates the complete pseudocode for invariant discovery in accordance with an embodiment of the present invention.

Table 10 illustrates a check of whether a MCF holds in accordance with an embodiment of the present invention.

Table 11 illustrates a second check of whether a MCF holds in accordance with an embodiment of the present invention.

Table 12 illustrates pseudocode for an induction step in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs), DVDs (digital versatile discs or digital video discs), or any device capable of storing data usable by a computer system.

Checking the Equivalence of Two Pipelined Designs

The present invention describes a method for formally checking whether two pipelined designs are equivalent. The two designs may have different pipeline depths, and may also include memories which can be read or written in every pipeline stage.

Figure 1A:
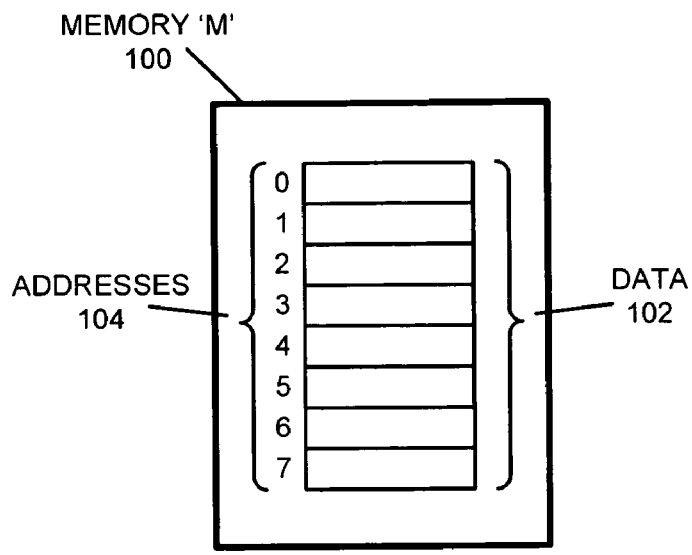
FIG. 1A illustrates a memory that can store multiple data items in accordance with an embodiment of the present invention.
Figure 1B:
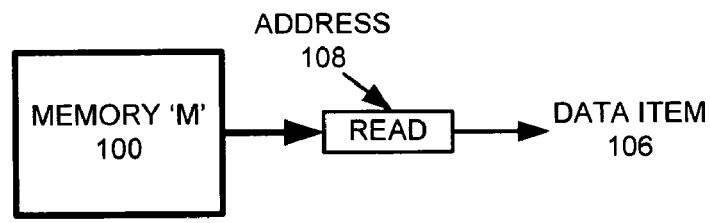
FIG. 1B illustrates a read operation performed on a memory as a data-flow graph in accordance with an embodiment of the present invention.
Figure 1C:
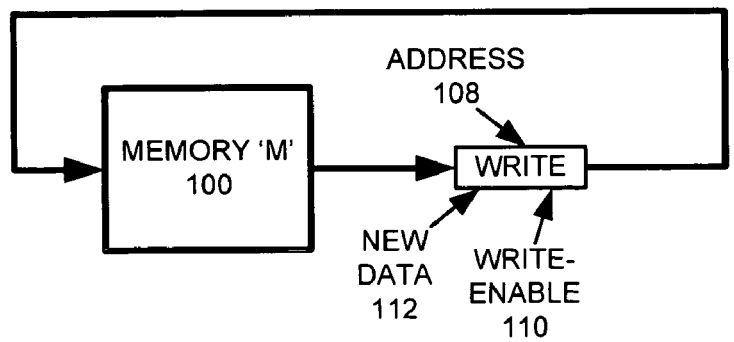
FIG. 1C illustrates a write operation performed on a memory as a data-flow graph in accordance with an embodiment of the present invention.

FIG. 1A illustrates a memory M 100 that can store multiple data items 102. Each data item has a unique address 104 in the memory. FIG. 1B and FIG. 1C illustrate read and write operations performed on memory M as data-flow graphs. In FIG. 1B, a read operation returns the data item 106 stored at the given address 108. In FIG. 1C, if the write-enable signal (WEN) 110 is high, the data item in memory M at the given address 108 is replaced by the new data 112. The result of the write operation is a changed memory M; if the write-enable is low, no write operation occurs.

FIG. 2A and FIG. 2B illustrate two designs. Design A in FIG. 2A is a non-pipelined design, which can be considered as a pipeline design with one stage, which reads from and writes to memory MA 202. The layout of memory MA 202 is shown on the right side of the figure; each data element in the memory is five bits wide, with the four high-order bits always zero and the low-order bit containing the actual data. The [0] operator extracts bit zero from its operand, while the {0000, ·} operator concatenates its operand with four zero bits, making the zero bits the most significant bits of the result. The two read operators read the data from the memory MA at the addresses determined by inputs A and C. The write operation writes to the memory address c in every clock cycle, since the write-enable signal (WEN) is always enabled (set to the value 1). These operations are shown in equation form in Table 1.

TABLE 1

D := extractBit0(MA[A])
MA[C] := MA[C] & { 0000, B }

Design B 210 in FIG. 2B is a pipelined design with three pipeline stages separated by pipeline registers. The design performs a computation on the input data and, after two cycles, produces the result. All paths from the inputs to the outputs pass through the same number of pipeline registers (equal to the number of stages minus one), with the exception of the memory, which may be read and written in any pipeline stage. The memory layout of memory MB 212 is shown on the right side of the figure; each data element in the memory comprises a single bit of information.

The system's goal is to prove that design A and design B are equivalent. When checking two pipelined designs for equivalence, the system uses a notion of equivalence that assumes that both designs start in their respective initial states and that both designs are fed with the same input data in every clock cycle. If each complete execution of the pipeline generates the same output data in both designs, then the two designs are equivalent. For the designs in FIGS. 2A and 2B, this notion of equivalence depends on the following two conditions:

1. The initial state of the write-enable register w in design B needs to be zero, thereby preventing the design from writing to the memory in the first cycle, when the input data has not yet been copied into the pipeline registers and as a result the pipeline registers still contain garbage. The information that the initial state of w is zero is either supplied by the user or determined by resetting the design. In the latter case, this can be achieved by giving the register w a reset input which is enabled when the design is reset.

2. The memories in both designs include the same data, albeit perhaps in different memory layouts. Typically, the initial state of memories after powering-up and resetting the designs is completely random. The designs can still be determined to be equivalent despite this randomness, but to achieve a successful equivalence check, the memories of both designs should start out in the same random state. The user can assure this state by providing a memory mapping between the two memories which is known to hold in the initial state.

Figure 3:
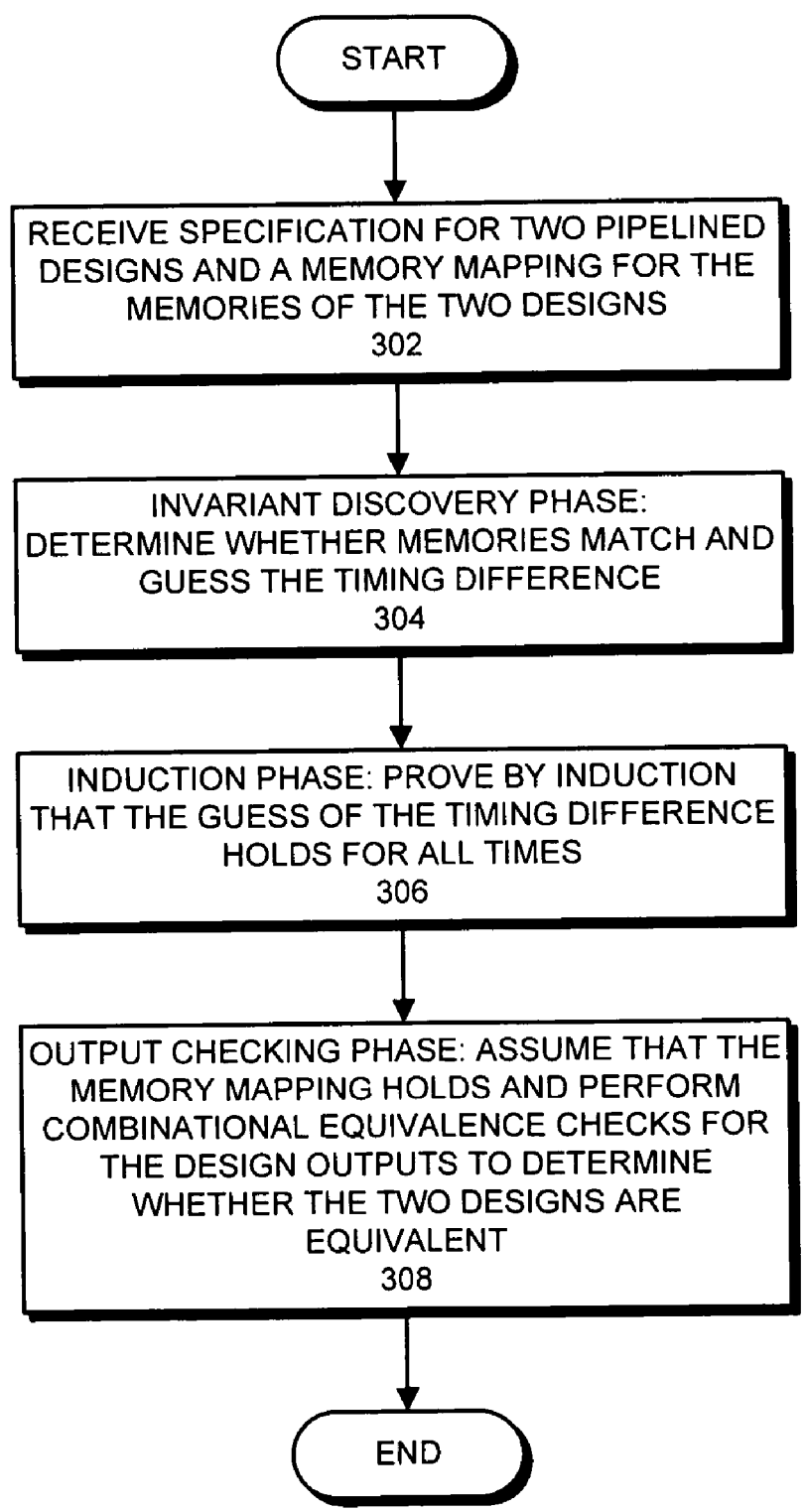
FIG. 3 presents a flow chart illustrating the process for checking whether two designs are equivalent in accordance with an embodiment of the present invention.

FIG. 3 presents a flow chart illustrating how the system described in the present invention receives a description for two designs containing memories and a memory mapping between the two memories (step 302), and then proceeds to check whether the two designs are equivalent. First, in the invariant discovery phase, the system determines whether the memories match after several cycles, and guesses the timing difference between the memories (step 304). Next, in the induction phase, the system proves by induction that the guess is true for all times (step 306). Finally, in the output checking phase, the system assumes that the memory correspondence holds, and performs combinational equivalence checks for the design outputs (step 308). Since a combinational equivalence check only checks the equivalence of logic outputs, and does not include the state and state transition checks included in a sequential equivalence check, these phases are computationally much less expensive than solving the general problem. The phases are described in greater detail in the following sections.

Memory Mappings

A memory mapping (MM) relates the contents of one memory to the contents of another memory, or several other memories. Memory mappings are needed if:

1. the layout of both memories differ;
2. a memory in one design is split into multiple memories in the other design; and/or
3. the same data is stored at different addresses in the two memories. Differing memory layouts frequently occur when comparing a design specified in a high-level language (e.g. C++) with a design specified at the register-transfer level (RTL).

Figure 4:
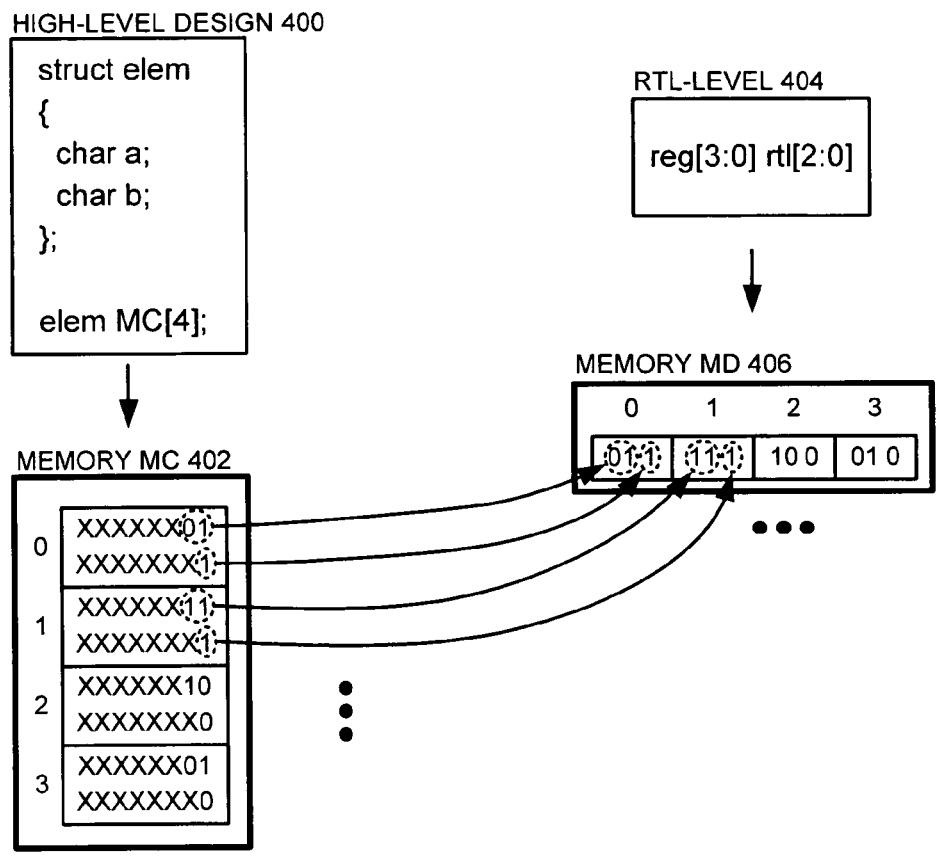
FIG. 4 illustrates a memory mapping between a high-level design and an RTL design in accordance with an embodiment of the present invention.

FIG. 4 illustrates a memory mapping between a high-level design 400 and an RTL design 404. The layout of memory MC 402 is determined by the C++ struct elem shown. Due to the limited number of data types in the high-level language, the system may represent a field in the struct with more bits than actually needed, as shown. On the other hand, in the RTL memory MD 406, the corresponding data may be stored in a compressed format. The memory mapping relates the bits and/or fields in one memory to corresponding bits and/or fields in another memory (or memories).

A memory mapping typically takes the form of an expression which relates operations on one memory to operations on another memory. For example, $$MM(MA,MB,a):=(\text{read}(MA,a)==\text{read}(MB,a))$$

specifies an exact one-to-one memory mapping. For memory mappings where the layout within each memory location is different, a "template" can be used to describe the mapping within a memory location. For instance, the two designs in FIG. 4 have a one-to-one mapping (e.g. memory location 0 in the high-level design 400 maps to memory location 0 in the RTL design 404), but the layout within each location is different. Bits 1 and 0 of the C++ struct field 'a' are mapped to bits 2 and 1 in the RTL, and bit 0 of the C++ struct field 'b' is mapped to bit 0 in the RTL. A template for this example is shown in Table 2. Alternatively, a mapping can also refer to bits directly, for instance if two RTL memories are related by the mapping. For the example in FIG. 4, in which the field 'a' is stored in bits [7:0] and the field 'b' is stored in bits [15:8] of a memory location, the template can also be specified as shown in Table 3.

TABLE 2 template t
{
    a = [2:1];
    b = [0];
}

TABLE 3 template t
{
    [1:0] = [2:1];
    [8]   = [0];
}

Templates provide a user-friendly way of specifying differing memory layouts within a memory location. Using template t from Table 2, a memory mapping for the designs in FIG. 4 is:

$$MM(MC,MD,a):=(\text{read}(MC,a)==\text{template } t(\text{read}(MD,a)).$$

Figure 5:
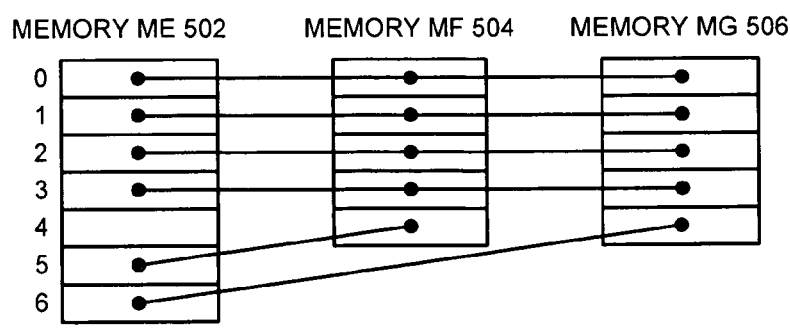
FIG. 5 illustrates a memory mapping between multiple memories in accordance with an embodiment of the present invention.

Memory mappings can also be used to relate multiple memories to each other, and/or handle cases where data items are stored at different addresses in memories. FIG. 5 illustrates a mapping from one memory, memory ME 502, to two memories MF 504 and MG 506. The first 4 memory addresses are mapped one-to-one across all three memories, but address 5 in memory ME 502 is mapped to address 4 in memory MF 504, while address 6 in memory ME 502 is mapped to address 4 in memory MG 506. Such a mapping often occurs if a single memory in one design is split into multiple memories in another design. A memory mapping for the memories in FIG. 5 is shown in Table 4.

TABLE 4

MM(MF,ME,a):= read(MF,a) == ((a<=3) ? read(ME,a) : read(ME,5)
MM(MG,ME,a):= read(MG,a) == ((a<=3) ? read(ME,a) : read(ME,6)

A memory mapping for the designs in FIG. 2A and FIG. 2B is shown in Table 5. For simplicity, the current description only proves in detail memory mappings between two memories, but mappings between multiple memories can always be expressed by several mappings between two memories, allowing the techniques described in the present invention to scale to more complex memory systems. This approach is not restricted to memories, but can also be applied to non-pipeline registers which can be read from or written to in every pipeline stage. Note that the left-hand side of the "==" operator in the memory map expression is a simple read from one memory.

TABLE 5

```
template s
{
    [0] = [0];
}
MM(MA,MB,a):= read(MA,a) == template s(read(MB,a))
```

Invariant Discovery Phase

In general, a given memory mapping is only known to be valid in the initial state of the two designs being compared. Due to memory writes in both designs, the mapping may not hold in subsequent cycles. If both designs are functionally equivalent, they should write the same data (modulo the differing memory layout) into their memories. However, due to different pipeline depths, such writes may occur in different cycles in both designs, so that the memory content in one design corresponds to the memory content in the other design at a different time step. The purpose of the invariant discovery phase is to find out if in fact the memories match up in later cycles and to determine the timing difference between the writes to the different memories. Therefore, the system assumes at the beginning of the invariant discovery phase that the user-given memory mapping holds in the initial state, and proceeds to symbolically simulate both designs for several cycles. Note that symbolic simulation does not simulate a particular set of patterns. Symbolic simulation injects symbolic variables at the design inputs, which represent all possible values these inputs may take on. Then, for all signals in the design, it builds expressions that describe the functions of the signals in terms of the input symbols. The system uses these expressions to check in which cycles the memories in both designs match, and proceeds to guess how the memories will match for a finite time.

Figure 6:
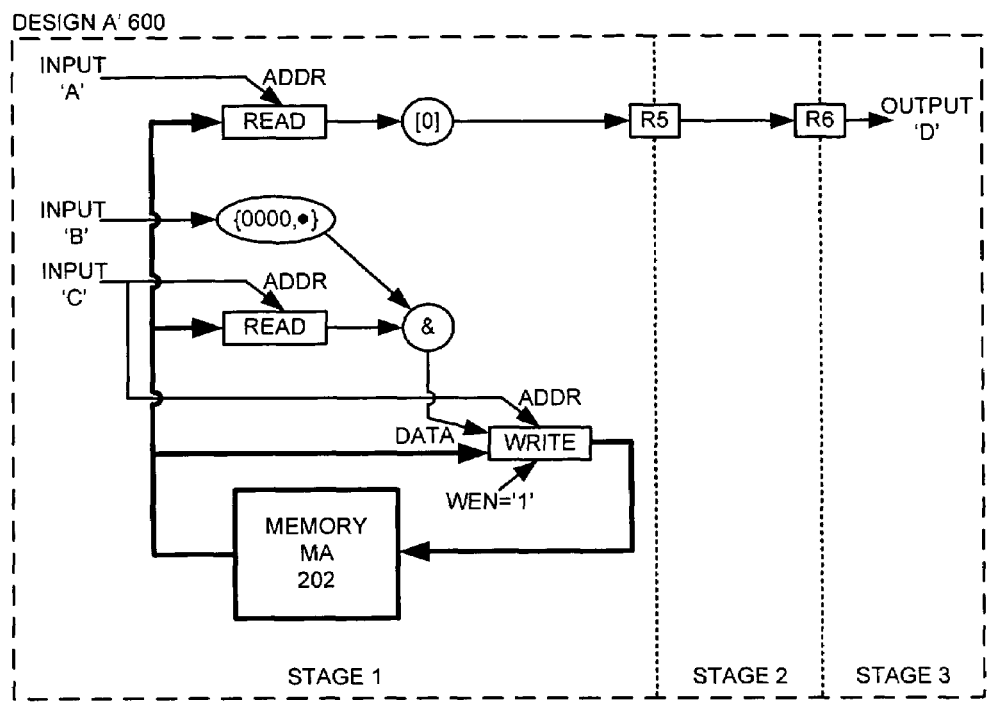
FIG. 6 illustrates a design in which two pipeline registers have been added to create two "dummy" pipeline stages in accordance with an embodiment of the present invention.

In one embodiment of the current invention, the system ensures that both designs have an equal pipeline depth by adding dummy stages to the design with fewer stages. This can help to synchronize the two designs, since a full execution of the pipeline then takes the same number of cycles in both designs. Table 6 shows pseudocode for appending dummy stages. In Table 6, the depth of pipelines for two designs are specified as da and db. The system adds the absolute value of (da−db) to the design with fewer stages. For the designs in FIG. 2A and FIG. 2B, which have one and three stages, da and db have the values one and three, respectively. As a result, the system appends two registers to every output in design A 200, while design B 210 remains unchanged. FIG. 6 illustrates design A' 600, in which two pipeline registers have been added to create two "dummy" pipeline stages.

TABLE 6

```
if (da > db) {
    for (int i = 0; i < (da − db); i++) {
        append register to every output in DA;
    }
} else {
    for (int i = 0; i < (db − da); i++) {
        Append register to every output in DB;
    }
}
```

Figure 7A:
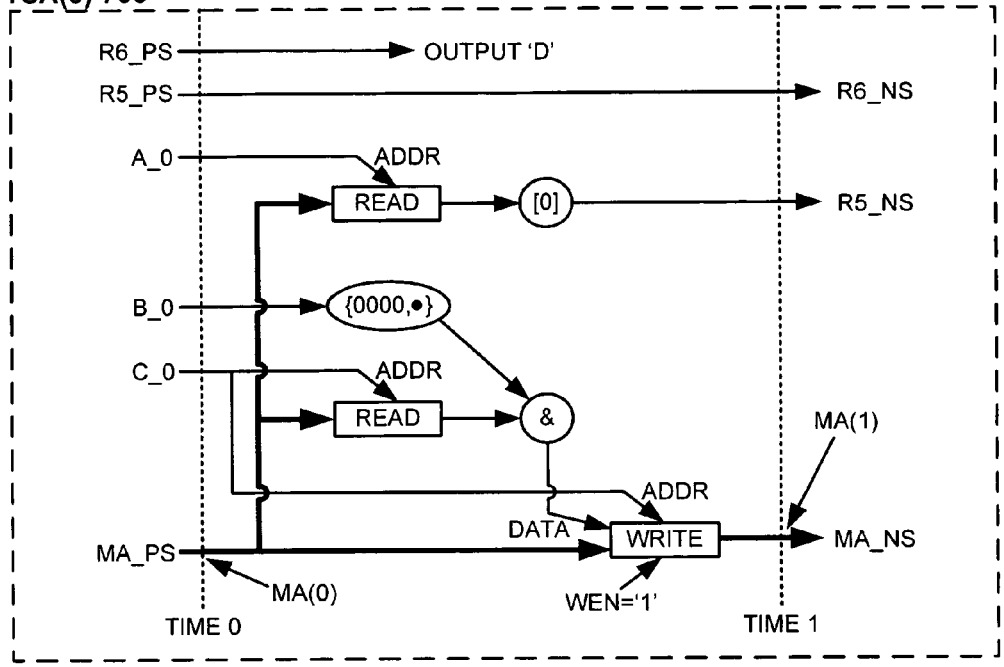
FIG. 7A illustrates a timestep model for one cycle of a first design in accordance with an embodiment of the present invention.
Figure 7B:
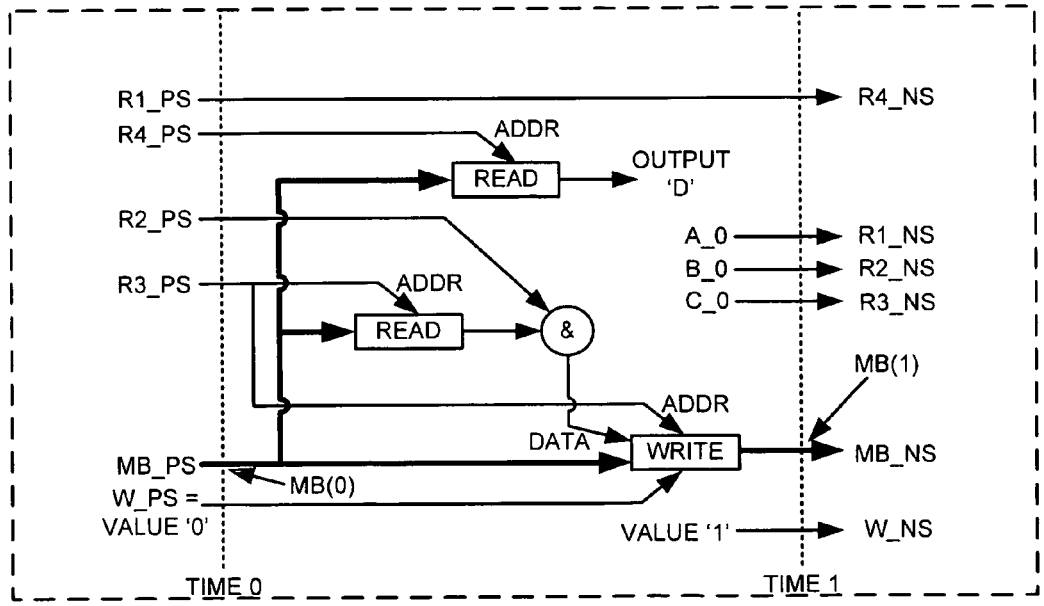
FIG. 7B illustrates a timestep model for one cycle of a second design in accordance with an embodiment of the present invention.

Next, the system creates a timestep model for both designs, in which the registers and memories are split up into inputs and outputs to the combinational logic of the design. First, the system creates the single timestep models TSA(0) 700 and TSB(0) 710, shown in FIG. 7A and FIG. 7B, respectively, for time t=0. In these figures, the values on the left indicate values of input signals at the beginning of the time interval, while the values on the right indicate the outputs from the time interval. For instance, R5_PS indicates the present state output of register R5, while R6_NS indicates the value that R6 will contain in the next state of symbolic simulation. The design inputs are indexed with the time (e.g. A_0, B_0). The system injects constant values for registers with a constant initial value at time t=0; these constant values can either be user-specified or automatically determined, for instance by simulating a reset sequence on the designs. In FIG. 7B, only register w has a constant initial value (W_PS=VALUE '0'). Note also that because inputs A_0, B_0, and C_0 are only actually used in stage 2 of FIG. 2B, these values are not input to any of the functional units in the design until after time t=1.

The system assumes that the given memory mappings hold between the memories at time t=0 by computing a memory correspondence formula (MCF) for each mapping that evaluates true if the two memory contents at the given time t, referred to as MA(t) and MB(t) (e.g. MA(0) and MB(0) at time t=0), correspond according to their given memory mapping. Pseudocode for memory correspondence is shown in Table 7, in which AS is the conjunction of all memory correspondences at time t=0, and is used as an invariant for the induction proof. Note that the "and" and the "forall" in Table 7 are used in the mathematical sense. The example of FIG. 2A and FIG. 2B includes only one memory map (shown in Table 5), thereby resulting in only one MCF and one AS (which is equal to the MCF), shown in Table 8.

TABLE 7

```
AS = 1;
Foreach memory map MM(MA, MB, a) {
    MCF(MA(0), MB(0)) = forall(a) (MM(MA(0), MB(0), a));
    AS = AS and MCF(MA(0), MB(0));
}
```

TABLE 8

```
MCF(MA(0),MB(0)) = forall(a) (read(MA(0),a) ==
    template s(read(MB(0),a)))
AS = MCF(MA(0), MB(0))
```

Complete pseudocode for invariant discovery is shown in Table 9. The system stores for each time and each MCF two pieces of information: 1) found (MCF, t), which is true if there is a memory correspondence for at least one of MA or MB at time t, and 2) d (MCF, t), which stores the difference in time between the corresponding memories in both designs. For example, if d(MCF,t)==3, then MA(t) corresponds to MB(t−3). If d(MCF,t)==−2, then MB(t) corresponds to MA(t−2). If d>0, MA is ahead in time, while if d<0, MB is ahead in time. At time t=0, because of known initial correspondence between the memories, found (MCF, 0) is true and d (MCF, 0)=0.

At time t=1, the system checks to see if the MCF still holds. The innermost loop (labeled in Table 9 as "innermost loop") tries to determine if there is:

1. a correspondence between MA(1) and MB(1);
2. a correspondence between MA(1) and any MB at an earlier time; or
3. a correspondence between MB(1) and any MA at an earlier time. If the system finds a correspondence, the system sets found (MCF, 1) to true. The function holds( ) proves whether its argument is true, and can be implemented with known proof techniques such as theorem provers, boolean satisfiability (SAT), and/or binary decision diagrams (BDDs). For the current example, the correspondences above correspond to:

1. A check of whether MCF (MA(1), MB(1)) holds under the assumption that AS holds, which is expanded in Table 10. The system determines MA(1) and MB(1) from the timestep models TSA(0) 700 and TSB(0) 710:
    MA(1)=write(MA(0), C_0, read(MA(0), C_0) & {0000, B_0}, 1)
    MB(1)=MB(0) (since the write enable is zero).
    A theorem prover can easily determine by substituting MA (1) and MB (1) into the formula of Table 10 that the result is false, since design A performs a write to the memory in the cycle, and design B does not.
2. A check of whether MCF(MA(1), MB(0)) holds under the assumption AS. The system determines this to be false, since design A performs a write.
3. A check of whether MCF (MA(0), MB(1)) holds under the assumption AS, which is expanded and shown to be true in Table 11. As a result, the system sets found (MCF,1):=true, and d(MCF,1):=−1.

TABLE 9

```
void invariant_discovery(DA,DB,AS)
{
    Create timestep model TSA and TSB from DA and DB;
    Create single timesteps TSA(0) and TSB(0) for time t=0.
    Set constant initial values for appropriate registers for t=0
```

TABLE 9-continued

```
    Foreach MCF {
        found(MCF, 0) := true;
        d(MCF, 0) := 0;
    }
    k := 0;
    Foreach time (t = 1; true; t++) {
        Foreach MCF {
            found(MCF, t) := false;
            Foreach time (i = t; i >= 0; i−−) { //innermost loop
                if holds(AS => MCF(MA(t), MB(i))) {
                    found(MCF, t) := true;
                    d(MCF, t) := t − i;
                    break;
                }
                if holds(AS => MCF(MA(i), MB(t))) {
                    found(MCF) := true;
                    d(MCF, t) := i − t;
                    break;
                }
            }
        }
        same := true;
        Foreach MCF {
            if (found(MCF, t) != found(MCF, t−1)) {
                same := false;
                k := t;
            }
            if (found(MCF, t) == true && d(MCF, t)
                != d(MCF, t−1)) {
                same := false;
                k := t;
            }
        }
        If (same) {
            Foreach MCF {
                found(MCF) := found(MCF, t);
                d(MCF) := d(MCF, t);
            }
            return found(MCF) and d(MCF) for all the MCFs and k.
        }
        Append timestep TSA(t), TSB(t);
    }
}
```

TABLE 10

```
holds (AS => MCF(MA(1), MB(1)))                ⇔
holds(MCF(MA(0), MB(0)) => MCF(MA(1), MB(1)))  ⇔
holds(forall(a) (read(MA(0),a) == template s(read(MB(0),a))) =>
    forall(b) (read(MA(1),b) == template s(read(MB(1),b))))
```

TABLE 11

```
holds (AS => MCF(MA(0), MB(1)))                ⇔
holds(MCF(MA(0), MB(0)) => MCF(MA(0), MB(0)))  ⇔
true (since MB(1) == MB(0))
```

The system then checks, in the next loop, if all the MCFs at time t=1 describe the same relationship between the memories as in time t=0. A check for a same relationships determines if exactly the same MCFs were found and the time difference between the corresponding memory contents is the same as at time t=0. In the current example, the first condition is not met, since d (MCF, 0)=0 and d(MCF,1)=1.

Figure 8:
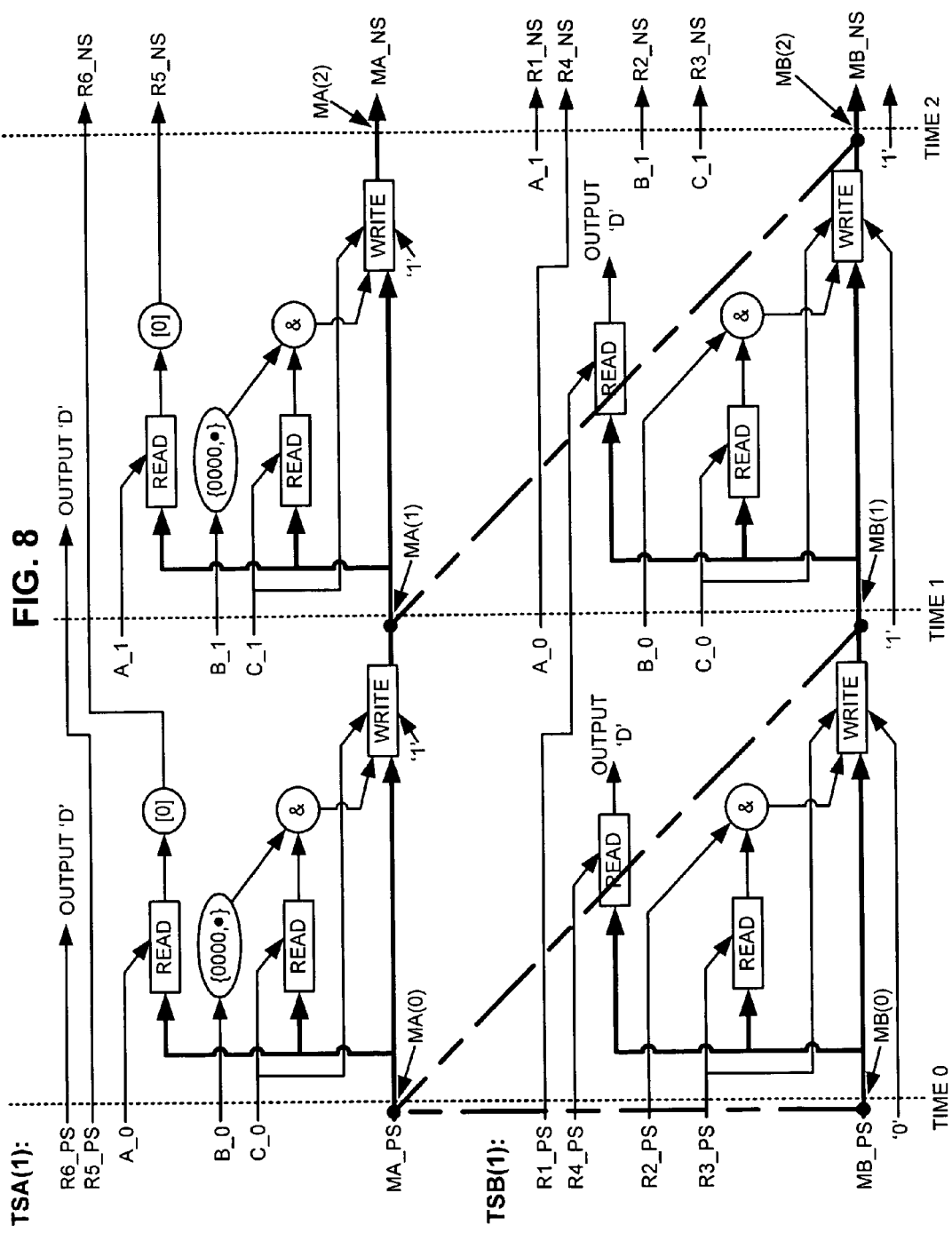
FIG. 8 illustrates a timestep model for two cycles of two unrolled pipeline designs in accordance with an embodiment of the present invention.

As a result, the system proceeds to unroll the pipeline and expand the timestep model for an additional cycle, as shown in FIG. 8. (Note that unrolling the design has the effect of making the intermediate registers go away, leaving the outputs as a combinational equation of input values.) FIG. 8 illustrates the previously detected correspondence between MA(0) and MB(0) and between MA(0) and MB(1) as a dashed line. The system then performs a substantially similar set of checks for time t=2, and finds that:
1. MCF (MA(2), MB(2)) is false under the assumption that AS holds, since there have been two writes in design A at MA(2), but only one write in design B at MB(2).
2. MCF(MA(2), MB(1)) is also false under assumption AS, since there have been two writes in design A at time t=2, and no writes in design B at time t=1.
3. MCF(MA(1), MB(2)) is true under assumption AS, and results in the system setting found (MCF,2):=true and d(MCF,2):=1.

The resulting memory correspondence is illustrated in FIG. 8 as a dashed line between MA(1) and MB(2).

Since found (MCF,2)==found (MCF,1), and d (MCF,2)== d(MCF,1), the system establishes a relationship between the two memories. The variable k in the pseudocode of Table 9 determines the previous time that the same relationship was true; in this example k==1. The procedure invariant_ discovery( ) returns k, found (MCF), and d(MCF) at the time when the same relationship is true for all of the MCFs.

As mentioned previously, the purpose of the invariant discovery phase is to guess the temporal relationships between memories. For each MCF, if a guess computed by invariant_discovery( ) has a true found (MCF), MA(t) corresponds to MB (t−d(MCF)) for all times t>=k. Otherwise, if found (MCF) is false, no correspondence could be detected for the given MCF. If a correspondence is found, the next step is to prove the correspondence for all times in the induction phase.

Note that designers often know when memories are supposed to correspond, and that the information returned by the invariant discovery phase can also be provided by a designer. In this case, the user-provided information about d(MCF), found(MCF), and k can be used directly in the induction phase, and the invariant discovery phase can be skipped.

The Induction Phase

The goal of the induction proof is to prove for all times that the outputs of both designs are equivalent. The system first performs an induction proof on the correspondence of the memories, and then uses this information in the proof of output equivalence. The induction proof involves two steps, the induction step and the induction base case.

In the induction step, the system assumes that the discovered MCFs hold in n consecutive time steps, and checks whether the guess of memory correspondence also holds for time step n+1. Note that the initial state is not injected into the registers in the induction step. The system determines the parameter n by trial, starting with n=0, and increasing n to a given maximum number nmax. If the system reaches nmax, all memory correspondences which have not been proven so far are assumed to be invalid. The pseudocode for the induction step is shown in Table 12. Note that in the pseudocode, the induction proof has been slightly reformulated. The system assumes that the MCFs hold in n−1 consecutive time steps, and checks if they still hold in time step n. The function induction_step returns the value of n that is needed to prove all MCFs. If nmax is reached and not all MCFs were proven, the proven ones are indicated by proven (MCF).

In the example, d(MCF) was determined in the invariant discovery phase to be −1. For n=0, nothing happens as n+d(MCF) is not greater or equal 0. For n=1, n+d(MCF)>=0 is true, but holds(1=>MCF(MA(0), MB(1)) is false, as there may be a write to memory MB. AS_indstep is updated to AS_indstep:=MCF(MA(0), MB(1)). For n=2, n+d(MCF) >=0 is true and holds(MCF(MA(0), MB(1))=>MCF(MA(1), MB(2))) is true since both designs write the same data into their memories (modulo the differing layout). Thus, all proven becomes true, proven (MCF)=1 and the returned n is 2.

TABLE 12

```
int induction_step(DA, DB)
{
    Create timestep model TSA and TSB from DA and DB.
    Foreach MCF with found(MCF) == true {
        proven(MCF) := false;
    }
    AS_indstep := 1;
    Foreach time (n = 0; n < nmax; n++) {
        Attach timestep TSA(n) and TSB(n);
        allproven := true;
        Foreach MCF with found(MCF) == true
                         And proven(MCF) == false {
            allproven := false;
            If (d(MCF) >= 0) {
                If (n − d(MCF) >= 0 &&
                        holds(AS => MCF(MA(n),
                        MB(n−d(MCF))))) {
                    proven(MCF) := true;
                }
            } else {
                If (n + d(MCF) >= 0 &&
                        holds(AS => MCF(MA(n+d(MCF)),
                        MB(n)))) {
                    proven(MCF) := true;
                }
            }
        }
        If (allproven) {
            return n;
        }
        Foreach MCF with found(MCF) == true {
            If (d(MCF) >= 0 && n − d(MCF) >= 0) {
                AS_indstep := AS_indstep & MCF(MA(n),
                MB(n−d(MCF)));
            } else
            If (d(MCF) < 0 && n + d(MCF) >= 0) {
                AS_indstep := AS_indstep &
                MCF(MA(n+d(MCF)), MB(n));
            }
        }
    }
    return nmax;
}
```

If the induction step succeeds for any MCF, the system next proves the induction base, which ensures that when starting in the initial state, there is a sequence of n subsequent cycles in which the memory correspondence holds. This is equivalent to checking that the discovered (and in the induction step proven) MCFs indeed hold in n consecutive cycles, which the system often already covers in the invariant discovery phase. The invariant discovery phase and the induction phase are typically computationally inexpensive, since the system considers only writes to memories.

At time step k (as determined in the invariant discovery phase), the correspondence MCF held already once. Thus, starting at time step k needs to prove that the correspondence holds for n−1 more time steps. In the example where k=1 and n=2 the system needs to prove that at time step 1, the MCF holds for one more time step. This proof is already covered in the invariant discovery phase.

The Output Checking Phase

In the previous phases, the system determined and proved the relationship between the memories in both designs. For an equivalence check, the system further proves in the output checking phase that the outputs of both designs are equivalent. This proof involves two steps:

1. Starting in the initial state, the system checks that the design outputs are equivalent for the length of the induction base in the induction phase. In one embodiment of the design, this check can be integrated into the induction base proof. Note that since some registers may start with garbage values, several cycles may elapse before some outputs become meaningful values. The system ignores these initial states in the equivalence check, comparing only meaningful values.

2. The system then unrolls the designs for the depth of the longest pipeline, so that the outputs depend purely on the inputs to the pipeline. The system assumes that the proven memory correspondence holds in every stage, and proceeds to prove that the outputs are equivalent for a single pipeline execution. Proving the equivalence of a single pipeline execution suffices to prove the equivalence of the designs for all times. Note that in some cases the system may need to unroll the design for a little more than the depth of the longest pipeline in order to take advantage of memory correspondences before the actual pipeline execution happens.

In the example, the system unrolls the design for 3 cycles and proves the output equivalence OA(3)=OB(3) under the assumption that MCF(MA(0), MB(1)) & MCF(MA(1), MB(2)) & MCF(MA(2), MB(3)) holds. The check of the outputs for the length of the induction base is not required as the outputs are ignored in the first two cycles anyway due to garbage in the pipeline registers.

For the output proof the memories at time t=0 are assumed to be independent (unless there exists a correspondence at t=0). Proving the output equivalence can be reduced to a purely combinational formula by exploiting the fact that reading from two memories MA(t1) and MB(t2) with the same address returns the same data if they have a memory correspondence MCP(MA(t1), MB(t2)). Furthermore, other techniques like the one described in M. Velev, R. E. Bryant, and A. Jain, "Efficient Modeling of Memory Arrays in Symbolic Simulation," CAV'97, LNCS 1254, Springer-Verlag, June 1997, pp. 388-399 can be used to make this formula independent of the memories.

By introducing the memory correspondences and proving that they hold for all times, the system can ensure that the output depends only on the previous inputs, and not on any other state in the memory. By logically removing the large memories from realistic industrial designs, the system reduces the equivalence check from a computational complex general sequential equivalence check to a simpler combinational equivalence check.

In summary, proving the equivalence of designs with memories typically involves a sequential equivalence check, which is computationally too expensive for realistic industrial designs because of the large state-space of the memories. If, however, a system can prove that the memory contents do not only match up in the initial state, but also before each pipeline execution, the proof of the output equivalence can be reduced to a combinational equivalence check. The system in the present invention uses a memory mapping and an invariant discovery phase to guess a memory relationship between the memories of two pipelined designs, proves the relationship using induction, and then performs a combinational equivalence check to determine if the two designs are equivalent. A successful comparison of the outputs results in a complete proof of the equivalence of the two designs.

Note that the present invention can prove equivalence for designs with differing memory layouts, and can handle mappings between multiple memories. The techniques in the present invention do not merely assume that the memory correspondence holds before each pipeline execution, but instead prove that the correspondence holds, and consider timing differences between the memory correspondences. The use of invariant discovery and/or induction phases to determine memory correspondence is novel.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for formally proving the functional equivalence of pipelined designs containing memories, comprising:
    receiving a specification for a first pipelined design and a specification for a second pipelined design; wherein the first pipelined design includes a first memory system and the second pipelined design includes a second memory system;
    determining a correspondence between operations on the first memory system and corresponding operations on the second memory system, wherein the correspondence enables memory operations to be represented in a combinational form based on design inputs, thereby allowing the first memory system to be logically abstracted out of the first pipelined design and the second memory system to be logically abstracted out of the second pipelined design; and
    comparing the combinational outputs of the first pipelined design and the combinational outputs of the second pipelined design to verify that the designs are functionally equivalent.

2. The method of claim 1, wherein the correspondence between operations on the first memory system and corresponding operations on the second memory system simplifies the verification of functional equivalence for the designs.

3. The method of claim 2, wherein in designs with different pipeline depths, write accesses to memories may occur in different cycles; and wherein determining the correspondence between the first memory system and the second memory system involves:
    symbolically simulating both pipelined designs for several cycles to discover the relationship between the first memory system and the second memory system;
    guessing in which pipeline cycles the contents of the first memory system and the contents of the second memory system match; and
    proving by induction that the guess holds for all times.

4. The method of claim 3,
    wherein the initial contents of the first memory system and the second memory system are assumed to be substantially the same; and
    wherein comparing the outputs further comprises unrolling the pipelines to represent design outputs as combinational blocks comprised of the pipeline stages but without pipeline registers.

5. The method of claim 4,
wherein knowing the initial state of a memory system and unrolling the pipelines allows subsequent read and write accesses from/to the memory system to be represented combinationally; and
wherein determining that the memory systems correspond in certain pipeline cycles allows checking the equivalence of the design outputs using a combinational equivalence check instead of a sequential equivalence check.

6. The method of claim 5, wherein the data outputs from an initial set of pipeline cycles do not comprise meaningful values, and are ignored in the equivalence comparison.

7. The method of claim 1, wherein the method is used to generate a complete proof that verifies that a register-transfer-level description of a design is functionally equivalent to an original high-level description of the design.

8. The method of claim 1, wherein the representation of data in the first memory system is different from the representation of data in the second memory system.

9. The method of claim 8, wherein the first memory system and/or the second memory system are comprised of multiple memories.

10. The method of claim 9, further comprising:
receiving a user-generated specification that specifies how the memory system of the first pipelined design and the memory system of the second pipelined design match; and
using the user-generated specification to assist in determining the correspondence between the first memory system and the second memory system.

11. A computer-readable storage medium storing instructions that when executed by a computer cause the computer to perform a method for formally proving the functional equivalence of pipelined designs containing memories, the method comprising:
receiving a specification for a first pipelined design and a specification for a second pipelined design; wherein the first pipelined design includes a first memory system and the second pipelined design includes a second memory system;
determining a correspondence between operations on the first memory system and corresponding operations on the second memory system, wherein the correspondence enables memory operations to be represented in a combinational form based on design inputs, thereby allowing the first memory system to be logically abstracted out of the first pipelined design and the second memory system to be logically abstracted out of the second pipelined design; and
comparing the combinational outputs of the first pipelined design and the combinational outputs of the second pipelined design to verify that the designs are functionally equivalent.

12. The computer-readable storage medium of claim 11, wherein the correspondence between operations on the first memory system and corresponding operations on the second memory system simplifies the verification of functional equivalence for the designs.

13. The computer-readable storage medium of claim 12, wherein in designs with different pipeline depths, write accesses to memories may occur in different cycles; and
wherein determining the correspondence between the first memory system and the second memory system involves:
symbolically simulating both pipelined designs for several cycles to discover the relationship between the first memory system and the second memory system;
guessing in which pipeline cycles the contents of the first memory system and the contents of the second memory system match; and
proving by induction that the guess holds for all times.

14. The computer-readable storage medium of claim 13,
wherein the initial contents of the first memory system and the second memory system are assumed to be substantially the same; and
wherein comparing the outputs further comprises unrolling the pipelines to represent design outputs as combinational blocks comprised of the pipeline stages but without pipeline registers.

15. The computer-readable storage medium of claim 14,
wherein knowing the initial state of a memory system and unrolling the pipelines allows subsequent read and write accesses from/to the memory system to be represented combinationally; and
wherein determining that the memories correspond in certain pipeline cycles allows checking the equivalence of the design outputs using a combinational equivalence check instead of a sequential equivalence check.

16. The computer-readable storage medium of claim 11, wherein the method is used to generate a complete proof that verifies that a register-transfer-level description of a design is functionally equivalent to an original high-level description of the design.

17. The computer-readable storage medium of claim 11, wherein the representation of data in the first memory system is different from the representation of data in the second memory system.

18. The computer-readable storage medium of claim 17, wherein the first memory system and/or the second memory system are comprised of multiple memories.

19. The computer-readable storage medium of claim 18, further comprising:
receiving a user-generated specification that specifies how the memory system of the first pipelined design and the memory system of the second pipelined design match; and
using the user-generated specification to assist in determining the correspondence between the first memory system and the second memory system.

20. An apparatus that formally proves the functional equivalence of pipelined designs containing memories, comprising:
a receiving mechanism configured to receive a specification for a first pipelined design and a specification for a second pipelined design; wherein the first pipelined design includes a first memory system and the second pipelined design includes a second memory system;
a correspondence mechanism configured to determine a correspondence between operations on the first memory system and corresponding operations on the second memory system, wherein the correspondence enables memory operations to be represented in a combinational form based on design inputs, thereby allowing the first memory system to be logically abstracted out of the first pipelined design and the second memory system to be logically abstracted out of the second pipelined design; and
a comparison mechanism configured to compare the combinational outputs of the first pipelined design and the combinational outputs of the second pipelined design to verify that the designs are functionally equivalent.

* * * * *